United States Patent
Fujii et al.

(10) Patent No.: US 9,960,018 B2
(45) Date of Patent: May 1, 2018

(54) RF SPUTTERING APPARATUS AND SPUTTERING METHOD

(71) Applicant: ULVAC, INC., Kanagawa (JP)

(72) Inventors: Yoshinori Fujii, Kanagawa (JP); Shinya Nakamura, Kanagawa (JP)

(73) Assignee: ULVAC, INC., Kanagawa (JP)

(*) Notice: Subject to any disclaimer, the term of this patent is extended or adjusted under 35 U.S.C. 154(b) by 0 days. days.

(21) Appl. No.: 15/329,097

(22) PCT Filed: Mar. 15, 2016

(86) PCT No.: PCT/JP2016/001459
§ 371 (c)(1),
(2) Date: Jan. 25, 2017

(87) PCT Pub. No.: WO2016/152089
PCT Pub. Date: Sep. 29, 2016

(65) Prior Publication Data
US 2017/0213706 A1    Jul. 27, 2017

(30) Foreign Application Priority Data
Mar. 25, 2015 (JP) .................................. 2015-062420

(51) Int. Cl.
*H01J 37/34* (2006.01)
*C23C 14/50* (2006.01)
(Continued)

(52) U.S. Cl.
CPC ...... *H01J 37/32697* (2013.01); *C23C 14/081* (2013.01); *C23C 14/35* (2013.01);
(Continued)

(58) Field of Classification Search
CPC ............. H01J 37/32697; H01J 37/3426; H01J 37/32715; H01J 37/3476; H01J 37/347;
(Continued)

(56) References Cited

U.S. PATENT DOCUMENTS 4,986,890 A * 1/1991 Setoyama ............... C23C 14/50
                                                        204/298.06
5,449,444 A * 9/1995 Yoshikawa ............. C23C 14/34
                                                        118/724
(Continued)

FOREIGN PATENT DOCUMENTS

JP    2010-077452 A    4/2010
JP    2011-068918 A    4/2011
(Continued)

OTHER PUBLICATIONS

International Search Report and Written Opinion for PCT Patent App. No. PCT/JP2016/001459 (dated May 10, 2016) with English language translation of the ISR.

*Primary Examiner* — Rodney G McDonald
(74) *Attorney, Agent, or Firm* — Cermak Nakajima & McGowan LLP; Tomoko Nakajima

(57) ABSTRACT

Provided is a RF sputtering apparatus in which film forming can efficiently be made by suppressing an amount of reverse sputtering at a substrate. The RF sputtering apparatus SM, according to this invention, in which RF power is applied in vacuum to a target to thereby perform film forming processing on one surface (Wa) of the substrate (W) is provided with a stage for holding the substrate in a state in which one surface thereof is left open in an electrically insulated state. The stage has a dented portion on such a holding surface as is adapted to hold thereon the substrate. A movable body, which is movable toward, and away from, the substrate, and is connected to grounding is disposed in a space defined by such an opposite surface of the substrate as is opposite to said one surface and an outline of the dented portion.

8 Claims, 4 Drawing Sheets

(51) Int. Cl.
  *H01J 37/32* (2006.01)
  *C23C 14/08* (2006.01)
  *C23C 14/52* (2006.01)
  *C23C 14/54* (2006.01)
  *C23C 14/35* (2006.01)

(52) U.S. Cl.
  CPC .............. *C23C 14/50* (2013.01); *C23C 14/52* (2013.01); *C23C 14/542* (2013.01); *H01J 37/32715* (2013.01); *H01J 37/3405* (2013.01); *H01J 37/347* (2013.01); *H01J 37/3426* (2013.01); *H01J 37/3476* (2013.01)

(58) Field of Classification Search
  CPC ...... H01J 37/3405; C23C 14/50; C23C 14/52; C23C 14/542; C23C 14/35; C23C 14/081
  USPC ............. 204/298.06, 298.14, 298.15, 192.12
  See application file for complete search history.

(56) References Cited

U.S. PATENT DOCUMENTS

| | | | |
|---|---|---|---|
| 6,270,618 B1 * | 8/2001 | Nakano | C23C 16/4405 |
| | | | 118/723 E |
| 2009/0145752 A1 * | 6/2009 | Barnes | G11B 5/855 |
| | | | 204/298.35 |
| 2010/0213047 A1 | 8/2010 | Nagamine et al. | |
| 2013/0001076 A1 | 1/2013 | Fujisato et al. | |

FOREIGN PATENT DOCUMENTS

| | | |
|---|---|---|
| JP | 2014-091861 A | 5/2014 |
| WO | WO2008/108349 A1 | 9/2009 |

* cited by examiner

RF SPUTTERING APPARATUS AND SPUTTERING METHOD

This application is a national phase entry under 35 U.S.C. § 371 of PCT Patent Application No. PCT/JP2016/001459, filed on Mar. 15, 2016, which claims priority under 35 U.S.C. § 119 to Japanese Patent Application No. 2015-062420, filed Mar. 25, 2015, both of which are incorporated by reference.

TECHNICAL FIELD

The present invention relates to a RF (radio frequency) sputtering apparatus and a sputtering method.

BACKGROUND ART

This kind of RF sputtering apparatus is known, e.g., in Patent Document 1. The apparatus in question is provided, inside a vacuum chamber, with a stage which holds a substrate to be subjected to processing in a state of leaving one surface thereof open and of being electrically insulated. Rare gas such as argon gas is introduced into the vacuum chamber that has been evacuated to a predetermined pressure. RF power is then applied to a target to thereby sputter the target, and the sputtered particles generated by the sputtering are caused to get adhered to, and deposited on, said one surface of the substrate, thereby forming a predetermined thin film.

It is to be noted here that, when the target is sputtered by applying RF power, self-bias potential is applied to the substrate that is held by the stage. It is generally known that, as a consequence, the ions and the like in the plasma of the rare gas are attracted toward the substrate and what has been deposited on the substrate will get sputtered, thereby giving rise to so-called reverse sputtering. Under the circumstances, if the amount of reverse sputtering increases, the rate of film forming will be lowered (the film-forming time becomes longer). As a consequence, it becomes important to suppress the amount of reverse sputtering to the best extent possible.

PRIOR ART DOCUMENTS

Patent Documents

Patent Document 1: JP2014-91861 A

SUMMARY OF THE INVENTION

Problems that the Invention is to Solve

Based on the above, this invention has a problem of providing a RF sputtering apparatus and a sputtering method which are capable, during film forming processing, of efficiently performing film formation while suppressing the amount of reverse sputtering to the best extent possible.

Means of Solving the Problems

In order to solve the above problems, a RF sputtering apparatus for performing film forming processing on one surface of a substrate by applying RF power to a target in vacuum has features in that the sputtering apparatus comprises: a stage for holding the substrate in a state of leaving said one surface open and of being electrically insulated, wherein the stage has a dented portion on such a holding surface as is adapted to hold thereon the substrate; and a movable body disposed in a space defined by such an opposite surface of the substrate as is opposite to said one surface and an outline of the dented portion when the substrate is held such that a peripheral edge portion thereof is held so as to come into contact with the holding surface of the stage. The movable body is movable toward, and away from, the substrate, and is connected to grounding.

According to this invention, when the movable body that is disposed in the stage is moved from a position that is away from the substrate toward the substrate, the distance between the opposite surface of the substrate and the movable body becomes smaller. As a result, the electrostatic capacity between the substrate and the movable body increases. Depending on this, when the target is sputtered by applying RF power, the self-bias potential to be applied to the substrate can be lowered. As a result, the amount of reverse sputtering on the substrate can be suppressed to the best extent possible, thereby efficiently performing film forming.

According to this invention, between the movable body and the grounding, preferably a circuit having predetermined or variable impedance is interposed. As the circuit having the variable impedance, there may be used a matching box.

In this invention, the movable body preferably comprises a first movable portion having such a confronting surface of a predetermined area as is confronting a central region of the substrate. According to this arrangement, by moving the first movable body in a direction toward, or away from, the substrate to thereby control the distance between the first movable portion and the substrate, the self-bias potential to be applied to the central region of the substrate is locally varied to thereby control the amount of reverse sputtering. Therefore, this arrangement is advantageous in adjusting the in-plane film thickness distribution. In this case, the RF sputtering apparatus preferably further comprises a measuring means for measuring an electrostatic capacity between the confronting surface and the substrate so as, based on the result of measurement, to obtain the amount of movement of the first movable portion. In this arrangement, the in-plane film thickness distribution can be adjusted at a higher accuracy. It is to be noted that the confronting surface may not only be constituted by a flat plane, but also be constituted by a curved plane.

In this invention, preferably the movable body further comprises at least one second movable portion which is disposed coaxially around the first movable portion, the second movable portion having such a ring-shaped surface of a predetermined area as is confronting a region exclusive of the central region of the substrate. The first and the second movable portions shall preferably be driven by respective driving means. According to this arrangement, by controlling the second movable portion, independent of the first movable portion, so as to be movable in a direction toward, or away from, the substrate, the distances between each of the movable portions and the substrate can be respectively controlled, whereby the in-plane film thickness distribution can advantageously be controlled in a finer manner.

A sputtering method according to this invention in which the above-mentioned apparatus is used comprises: an adjusting step for adjusting the position of the movable body by moving the movable body, relative to the substrate, toward or away therefrom; and a film forming step for sputtering the target, after having adjusted the position of the movable body, by applying RF power to the target, thereby allowing sputtered particles to adhere to, and deposit on, said one surface of the substrate in order to thus form films.

In this invention, the adjusting step preferably further comprises a measuring step for measuring an electrostatic capacity between the confronting surface and the substrate, thereby obtaining an amount of movement of the movable body based on the result of measuring.

MODES FOR CARRYING OUT THE INVENTION

With reference to the accompanying drawings, a description will now be made of a RF sputtering apparatus according to an embodiment of this invention with reference to an example in which a substrate to be subjected to film-forming processing W is a silicon substrate and an aluminum oxide film as an electrically insulating film is formed on a surface of the silicon substrate.

Figure 1:
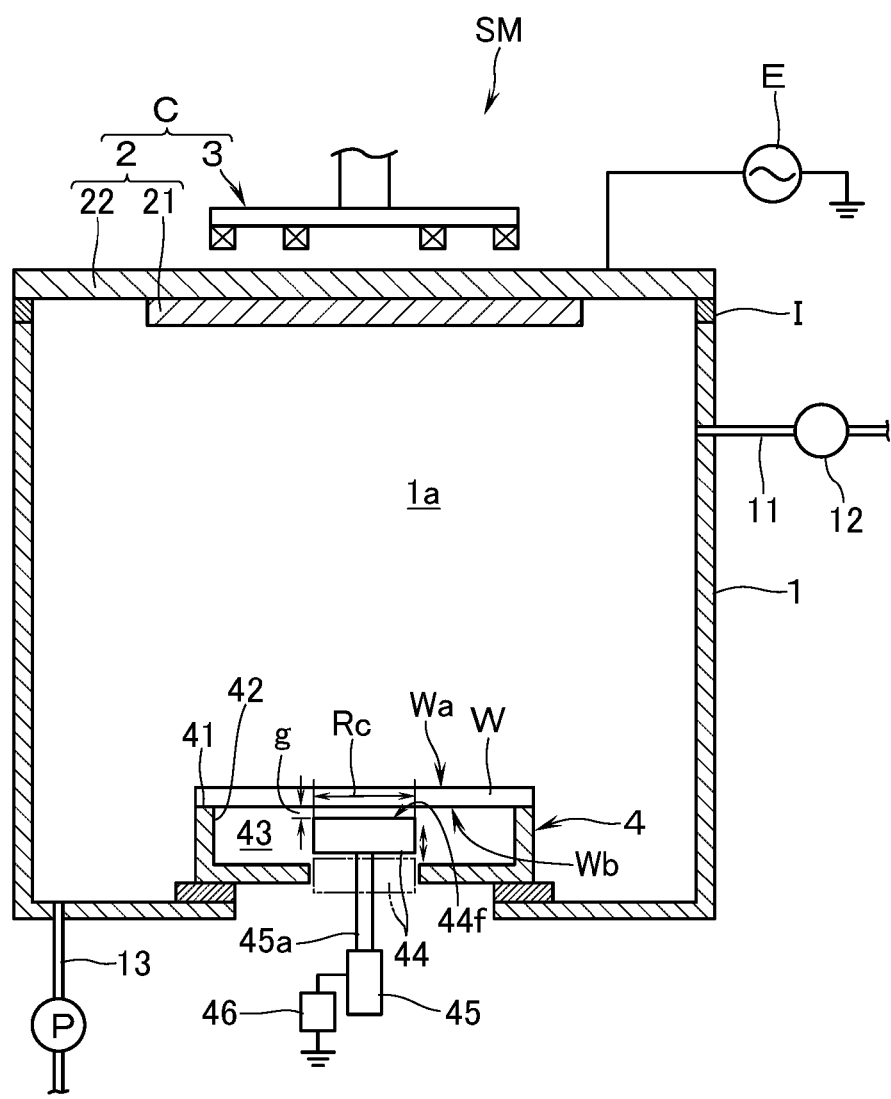
FIG. 1 is a schematic sectional view showing a RF sputtering apparatus according to an embodiment of this invention.

With reference to FIG. 1, reference characters SM denote a magnetron sputtering apparatus. This sputtering apparatus SM is provided with a vacuum chamber 1 which defines a processing chamber 1a. To a side wall of the vacuum chamber 1, there is connected a gas pipe 11 for introducing a sputtering gas which is a rare gas such as argon and the like. The gas pipe 11 has interposed therein a mass flow controller 12 and is in communication with a gas supply source (not illustrated). According to this arrangement, the flow-controlled sputtering gas can be introduced into the processing chamber 1a that has been evacuated, at a constant evacuating speed, by an evacuating means P which is to be described hereinafter. It is thus so arranged, during the film forming processing, that the pressure in the processing chamber 1a is maintained substantially constant. To the bottom of the vacuum chamber 1, there is connected an exhaust pipe 12 which is in communication with the evacuating means P which comprises a turbo-molecular pump, a rotary pump, and the like. At the ceiling portion of the vacuum chamber 1, there is disposed a cathode unit C. In the following, description will be made on condition that the direction looking toward the ceiling portion, as seen in FIG. 1, is defined as "upper" side and that the direction looking toward the bottom side is defined as "lower" side.

The cathode unit C is made up of a target assembly 2 and a magnet unit 3 which is disposed above the target assembly 2. The target assembly 2 is made up, depending on the profile of the substrate W, of: a target 21 which is made of aluminum oxide and which is formed into a circular plate shape as seen in plan view (i.e., as seen from top downward) by a known method; and a backing plate 22 which is bonded to an upper surface of the target 21 by means of a bonding material (not illustrated) such as indium and the like. It is so arranged that, during film forming by sputtering, the target 21 can be cooled by circulating a cooling medium (cooling water) through the inside of the backing plate 22. In a state in which the target 21 has been attached, the peripheral portion of the lower surface of the backing plate 22 is fixed to the upper portion of the side wall of the vacuum chamber 1 through an electrically insulating body 1. The target 21 has connected thereto an output from a RF power source E so that, at the time of film-forming processing, RF power is applied to the target 21.

The magnet unit 3 has a known construction in that a magnetic field is generated in a space below the lower surface, serving as a sputtering surface, of the target 21 and that the electrons and the like that are ionized below the sputtering surface at the time of sputtering are collected to thereby efficiently ionize the sputtered particles that are scattered from the target 21. Therefore, detailed explanation thereof is omitted here.

At the bottom portion of the vacuum chamber 1, there is disposed a stage 4, e.g., of metallic make, in a manner to lie opposite to the target 21. It is thus so arranged that the substrate W is held in position in a state in which such an upper surface of the substrate W as is a film-forming surface is left open. In this case, the distance between the target 21 and the substrate W is set to be within a range of 25~80 mm taking into account the productivity, number of scattering, and the like. By the way, the stage 4 may alternatively be constituted by a known electrostatic chuck.

The stage 4 has a dented portion 42 on the holding surface 41 for holding the substrate W. When the substrate W is held in position such that an outer peripheral portion of the substrate W is in contact with the holding surface 41, a space 43 is defined by the opposite surface Wb of the substrate W and an outline of the dented portion 42. This space 43 is provided with a movable body 44 that is connected to the grounding. The movable body 44 has connected thereto a driving shaft 45a of a known driving means 45. It is thus so arranged that, by driving the driving shaft 45a in an up-and-down direction with a control means to be described hereinafter, the movable body 44 can be moved back and forth relative to the substrate W. Between the movable body 44 and the grounding there is interposed a circuit 46 having predetermined or variable impedance. As the circuit 46 there may be used a known one having elements such as resistances, coils, capacitors, and the like (not illustrated). As the circuit 46 having variable impedance, there may be used a known matching box that is capable of adjusting the impedance. Alternatively, the movable body 44 may be connected to the grounding without interposing the circuit 46 (see FIG. 2). In addition, in order to hold the evacuated state in the vacuum chamber 1a, there is provided a known vacuum sealing means such as a vacuum bellows (not illustrated) and the like.

Figure 3A:
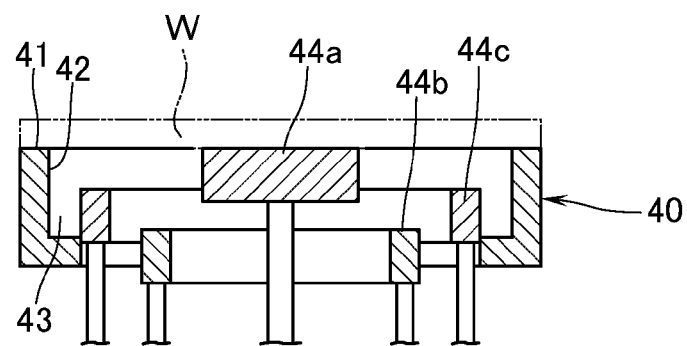
FIG. 3A is a sectional view showing a modified example of the movable body and FIG. 3B is a plan view of the modified example of the movable body.
Figure 3B:
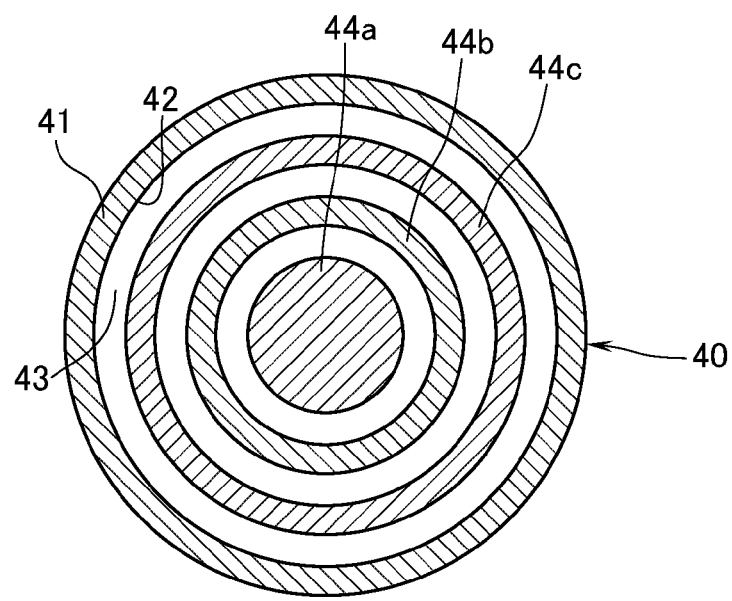

Although not particularly illustrated, the above-mentioned sputtering apparatus SM has a known control means which is provided with a microcomputer, sequencer, and the like. It is thus so arranged that the control means performs an overall control of the operation of the RF power source E, the operation of the mass-flow controller 12, the operation of the evacuating means P and the operation of the driving means 45. With reference also to FIG. 3, a description will hereinafter be made of the sputtering method according to this invention based on an example in which, by using the above-mentioned sputtering apparatus SM, an aluminum oxide film is formed on the surface of the silicon substrate W.

First of all, the driving means 45 is driven so that the movable body 44 disposed in the stage 4 is moved from a position away from the substrate W to a position closer thereto, thus adjusting the position of the movable body 44. As a result, the distance g between the opposite surface Wb of the substrate W and the movable body 44 becomes smaller, whereby the electrostatic capacity between the substrate W and the movable body 44 increases (adjusting step). Then, by controlling the mass-flow controller 12, argon gas is introduced at a predetermined flow rate (e.g., 100 sccm) (at this time the pressure inside the processing chamber 1a becomes 1.3 Pa). Together with the above operations, e.g., 500~5000 W of RF electric power in 13.56 MHz of frequency is applied from the RF power source E to the target 21 to thereby form plasma inside the vacuum chamber 1 in order to sputter the target 21. At this time, as a result of increase in the above-mentioned electrostatic capacity, the self-bias potential (Vdc) to be applied to the substrate W can be lowered. As a result, the amount of reverse sputtering at the substrate W can be suppressed to the best extent possible, whereby an aluminum oxide film can be formed efficiently (film forming step).

Here, the first movable portion which forms the movable body 44 has a confronting surface 44f which confronts a central region Rc of the substrate W. Therefore, if this first movable portion 44 is moved toward, or away from, the substrate W, the self-bias potential that is applied to the central region Rc of the substrate W can be locally varied. The amount of reverse sputtering in the central region Rc can thus be controlled, and the in-plane film thickness distribution can be adjusted.

Figure 2:
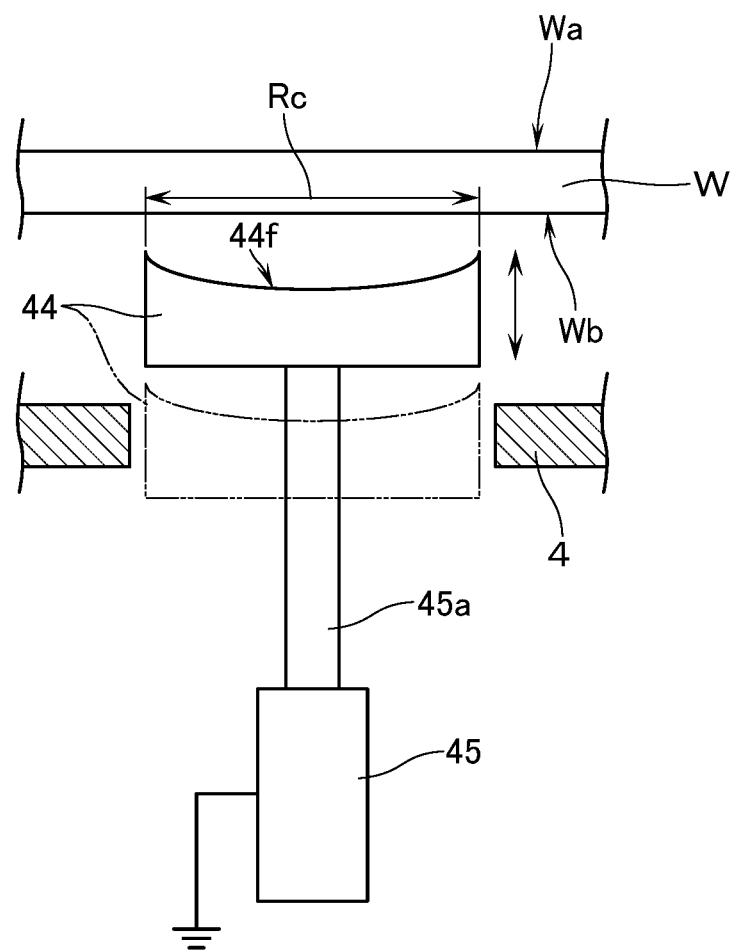
FIG. 2 is a sectional view showing a modified embodiment of a movable body.

It is to be noted that the confronting surface 44f of the movable body 44 may include not only the one arranged to be flat surface as shown in FIG. 1, but also the one arranged by a curved surface as shown in FIG. 2. By arranging the confronting surface 44f into a curved surface, the amount of reverse sputtering at the central region Rc of the substrate W can be finely controlled depending on the curvature of the curved surface. In turn, the in-plane film thickness distribution can be finely controlled.

Further, as shown in FIG. 3, the movable body 44 has at least one more piece (two more pieces in the example shown in FIG. 3) of the second movable portion 44b, 44c which is disposed coaxially around the first movable portion 44a and which has such a ring-shaped surface of a predetermined area as is confronting the region except for the central region Rc of the substrate W. Preferably, the first movable portion and both the second movable portions 44a, 44b, 44c are respectively driven by the driving means. Since the driving means is known, the illustration thereof in FIG. 3 is omitted. According to this arrangement, by respectively moving each of the movable portions 44a, 44b, 44c to thereby control the distance between each of the above movable portions and the substrate W, respectively, the places for adjusting the amount of reverse sputtering increase in the diametrical direction. Therefore, the in-plane film thickness distribution can still further be finely controlled. Here, in order to control the in-plane film thickness distribution of the amount of reverse sputtering, an arrangement may be made in which: by using measuring means (not illustrated) the electrostatic capacity is measured between each of the movable portions 44a, 44b, 44c and such a portion of the substrate W as is confronting the movable portions; in order for the measured electrostatic capacity to become a desired value (for example, so that each coincides with one another), an amount of movement of each of the movable portions 44a, 44b, 44c is obtained; depending on the obtained amounts of movement, each of the driving means is driven; and the distance between each of the movable portions 44a, 44b, 44c and the substrate W is controlled. The measuring means may be used of the known ones: such as the one in which the electrostatic capacity is obtained, like a laser displacement sensor, from the distance to the substrate W; and the one in which, while one pole is kept contacted, an AC voltage is applied to the pole to be measured so that the electrostatic capacity is obtained from the flowing electric current; and so on. Therefore, a detailed description thereof is omitted here.

A description has so far been made of an embodiment of this invention. However, this invention shall not be limited to the above. In the above-mentioned embodiment, a description has been made of an example in which an insulating film is formed by using a target made of an insulating material such as aluminum oxide. This invention may also naturally be applicable to a case in which a metallic film is formed by using a metallic target.

Figure 4:
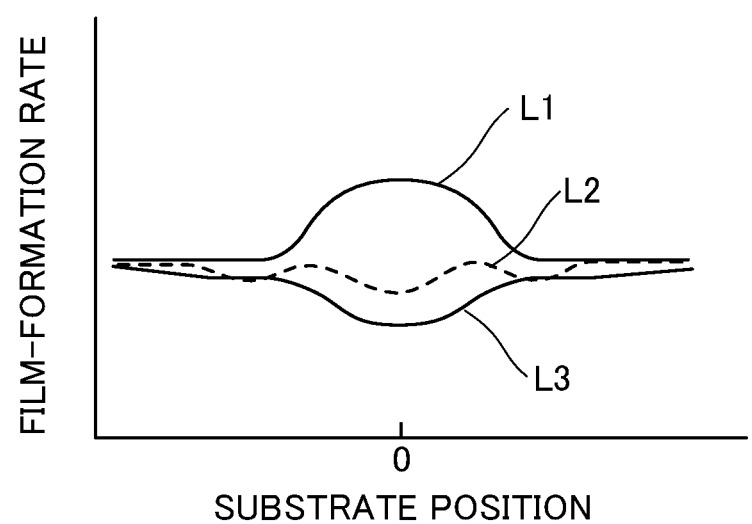
FIG. 4 is a graph showing the results of experiments to confirm the effect of this invention.

Next, in order to confirm the above-mentioned effects, the following experiments were carried out by using the above-mentioned sputtering apparatus SM. In these experiments, as the substrate W there was used a silicon substrate of Φ300 mm. After setting the substrate W onto the stage 4 inside the vacuum chamber 1, the movable body 44 was moved up to adjust the distance to 0.4 mm between the opposite surface Wb of the substrate W and the movable body 44. Then, argon gas in the flow amount of 100 sccm was introduced into the processing chamber 1a (at this time the pressure inside the processing chamber 1a was about 1.3 Pa), and RF power of 13.56 MHz was applied at 600 W to the stage 4. As a result, plasma was formed inside the processing chamber 1 and the aluminum oxide target 21 was sputtered to thereby form an aluminum oxide film on one surface Wa of the substrate W. The film-formation rate at this time was measured and the results are shown in FIG. 4 by a solid line L1. The abscissa represents the position of the substrate W as seen in the diametrical direction. It has been confirmed that the in-plane distribution of the film-formation rate at this time was 2.04%. By further moving the movable body 44 toward the substrate W so as to adjust the distance between the two to be 0.1 mm, and sputtering was carried out on the similar conditions as above. The film-formation rate at this time was measured and the results are shown by dashed line L2 in FIG. 4. The in-plane distribution of the film-formation rate was 1.27%. It has thus been found that the in-plane film thickness distribution can be adjusted by changing the distance between the movable body 44 and the substrate W. This is estimated to be due to the features in that: the self-bias potential that is applied to the substrate W can be adjusted and that; the amount of reverse sputtering can be adjusted. In addition, the movable body 44 was further moved up to thereby bring it into contact with the substrate W (the distance between the two was 0.0 mm). Sputtering was then carried out on the similar conditions as above. The film-formation rate at that time was measured. As shown by line L3 in FIG. 4, the in-plane distribution of the film-formation rate was confirmed to be 1.39%.

EXPLANATION OF REFERENCE CHARACTERS

SM RF sputtering apparatus
W substrate (substrate to be subjected to processing)
Wa one surface of the substrate W
Wb opposite surface of the substrate W
Rc central region of the substrate W
4 stage
41 holding surface
42 dented portion
43 space
44 movable body
44a first movable portion
44b, 44c second movable portion 44*f* confronting surface
45 driving means
46 circuit

The invention claimed is:

1. A RF sputtering apparatus for performing film forming processing on one surface of a substrate by applying RF power to a target in vacuum, the sputtering apparatus comprising:
   a stage for holding the substrate in a state of leaving said one surface open and of being electrically insulated, wherein the stage has
      a holding surface holding the substrate at a peripheral edge portion of the substrate from an opposite surface of the substrate opposite to said one surface,
      a dented portion formed on the holding surface, and
      a space defined by the opposite surface of the substrate and an outline of the dented portion,
      a movable body disposed in the space and located in a center region of the substrate so that the movable body is movable toward and away from the substrate and being connected to grounding.

2. The RF sputtering apparatus according to claim 1, further comprising, between the movable body and the grounding, a circuit having a predetermined or a variable impedance.

3. The RF sputtering apparatus according to claim 1, wherein the movable body comprises a first movable portion having a confronting surface of a predetermined area confronting a central region of the substrate.

4. The RF sputtering apparatus according to claim 3, further comprising a measuring means for measuring an electrostatic capacity between the confronting surface and the substrate.

5. The RF sputtering apparatus according to claim 3, wherein the movable body further comprises at least one second movable portion which is disposed coaxially around the first movable portion, the second movable portion having a ring-shaped surface of a predetermined area confronting a region exclusive of the central region of the substrate,
   wherein the first and the second movable portions are driven by respective driving means.

6. A sputtering method in which the apparatus according to claim 1 is used, the method comprising:
   an adjusting step for adjusting the position of the movable body by moving the movable body, relative to the substrate, toward or away therefrom; and
   a film forming step for sputtering the target, after having adjusted the position of the movable body, by applying RF power to the target, thereby allowing sputtered particles to adhere to, and deposit on, said one surface of the substrate in order to thus form a film.

7. The sputtering method according to claim 6, wherein the adjusting step comprises a measuring step for measuring the electrostatic capacity between a confronting surface of the movable body and the substrate, thereby obtaining an amount of movement of the movable body based on a measured result.

8. A RF sputtering apparatus for performing film forming processing on one surface of a substrate by applying RF power to a target in vacuum, the sputtering apparatus comprising:
   a stage for holding the substrate in a state of leaving said one surface open and of being electrically insulated, wherein the stage has a dented portion on such a holding surface as is adapted to hold thereon the substrate; and
   a movable body disposed in a space defined by such an opposite surface of the substrate as is opposite to said one surface and an outline of the dented portion when the substrate is held such that a peripheral edge portion thereof is held so as to come into contact with the holding surface of the stage, the movable body being movable toward, and away from, the substrate, and being connected to grounding, and
   wherein the movable body comprises a first movable portion having a confronting surface of a predetermined area confronting a central region of the substrate, and
   a diameter of the first movable portion is smaller than a diameter of the substrate so as to locally vary self-bias potential, control an amount of reverse sputtering, and adjust an in-plane film thickness distribution on the substrate.

* * * * *